(12) United States Patent
Taylor et al.

(10) Patent No.: US 7,476,953 B2
(45) Date of Patent: Jan. 13, 2009

(54) INTEGRATED SENSOR HAVING A MAGNETIC FLUX CONCENTRATOR

(75) Inventors: William P. Taylor, Amherst, NH (US); Richard Dickinson, South Boston, MA (US); Michael C. Doogue, Manchester, NH (US); Sandra R. Pinelle, Nashua, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 11/051,124

(22) Filed: Feb. 4, 2005

(65) Prior Publication Data

US 2006/0175674 A1  Aug. 10, 2006

(51) Int. Cl.
*H01L 43/00* (2006.01)

(52) U.S. Cl. .................. 257/421; 257/108; 257/414; 257/422; 257/423; 257/425; 257/427

(58) Field of Classification Search ............. 257/421, 257/108, 414, 422, 423, 424, 425, 427
See application file for complete search history.

(56) References Cited

U.S. PATENT DOCUMENTS

| 4,283,643 | A | 8/1981 | Levin |
| 4,772,929 | A | 9/1988 | Manchester |
| 5,247,202 | A | 9/1993 | Popovic et al. |
| 5,883,567 | A | 3/1999 | Mullins, Jr. |
| 6,184,679 | B1 | 2/2001 | Popovic et al. |
| 6,356,068 | B1 | 3/2002 | Steiner et al. |
| 6,545,457 | B2 | 4/2003 | Goto et al. |
| 2004/0155644 | A1 | 8/2004 | Stauth et al. |
| 2004/0184196 | A1* | 9/2004 | Jayasekara ............. 360/319 |
| 2006/0033487 | A1 | 2/2006 | Nagano et al. |

FOREIGN PATENT DOCUMENTS

| CH | 683 469 | A5 |   | 3/1994 |
| DE | 103 14 602 | A1 |   | 10/2004 |
| EP | 1 443 332 | A1 |   | 8/2004 |
| JP | 63-263782 |   | * | 10/1988 |
| JP | 9-166612 |   |   | 6/1997 |
| JP | 09-166612 |   | * | 6/1997 |
| JP | 2004-356338 |   | * | 12/2004 |
| WO | WO 03/107018 | A1 |   | 12/2003 |

OTHER PUBLICATIONS

PCT Search Report & Written Opinion for PCT/US2006/000363 dated May 11, 2006.

* cited by examiner

*Primary Examiner*—Evan Pert
*Assistant Examiner*—Tan Tran
(74) *Attorney, Agent, or Firm*—Daly, Crowley, Mofford & Durkee, LLP

(57) ABSTRACT

An integrated sensor has a magnetic field sensing element and first and second relatively high magnetically permeable members forming a gap, wherein the magnetic field element is disposed within the gap. The magnetically permeable members provide an increase in the flux experienced by the magnetic field sensing element in response to a magnetic field. The integrated sensor can be used as a current sensor, a proximity detector, or a magnetic field sensor.

35 Claims, 8 Drawing Sheets

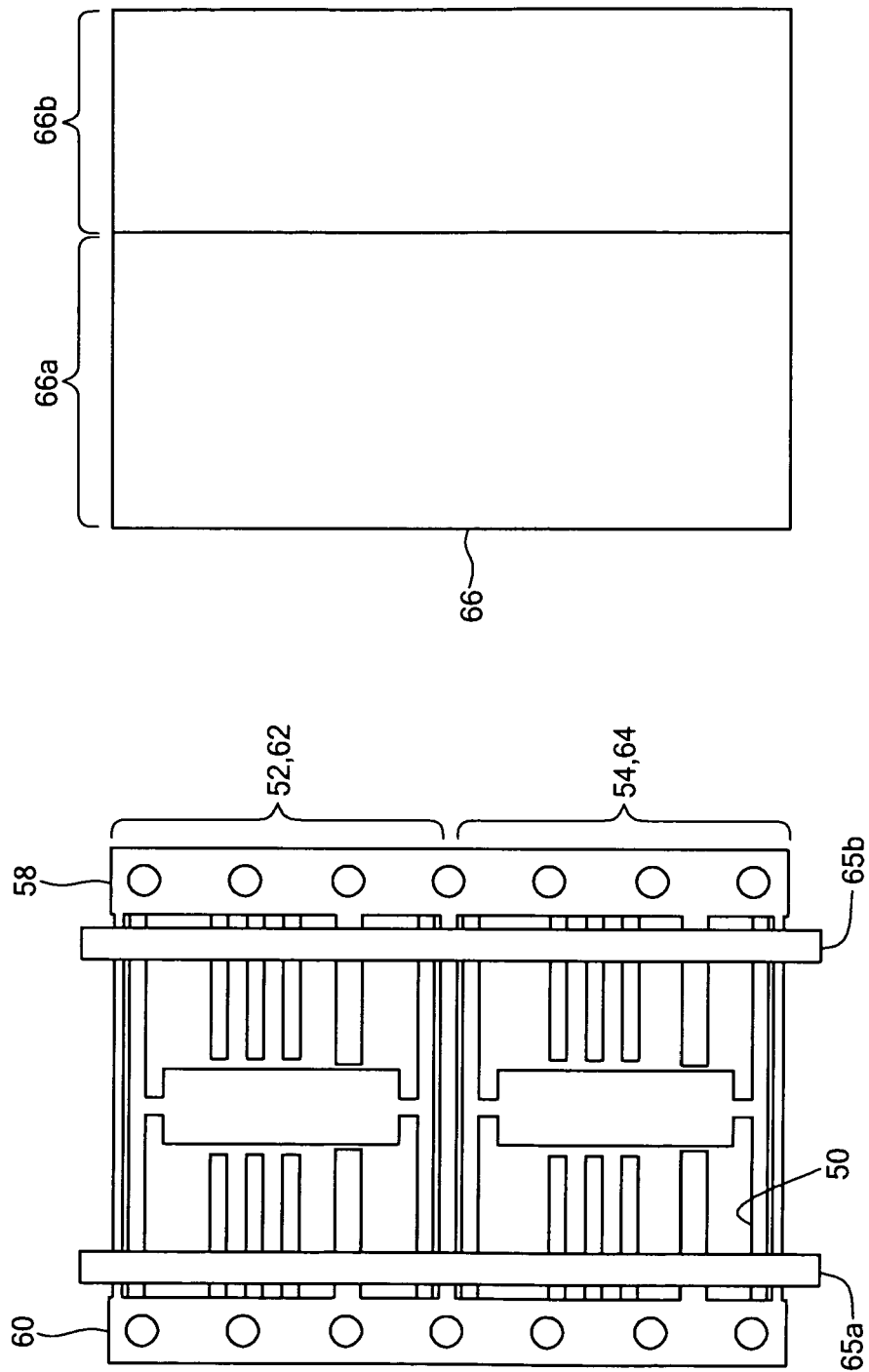

INTEGRATED SENSOR HAVING A MAGNETIC FLUX CONCENTRATOR

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to packaged integrated circuits and, more particularly, to an integrated sensor having an integrated magnetic flux concentrator.

BACKGROUND OF THE INVENTION

Current sensors are known to those of ordinary skill in the art. One type of conventional current sensor uses a magnetic field sensing element (for example a Hall effect element or magnetoresistance element) in proximity to an electrical conductor. The magnetic field sensing element generates an output signal having a magnitude proportional to the magnetic field induced by an electrical current that flows through the electrical conductor. Therefore, it will be understood that the current sensor senses a magnetic field associated with the electrical current.

Some typical current sensors include a gapped toroid magnetic flux concentrator, with the magnetic field sensing element positioned in the toroid gap. The magnetic field sensing element and toroid are assembled into a housing, which is mountable on a printed circuit board. In use, an electrical conductor, such as a wire, is passed through the center of the toroid. The toroid acts as a magnetic flux concentrator, providing an increased magnetic field through the magnetic field sensing element, and therefore, a more sensitive device. However, such devices tend to be undesirably large, both in terms of height and circuit board area.

Proximity detectors (also referred to herein as rotation detectors) for detecting ferromagnetic or magnetic objects are also known. One application for such devices is in detecting the approach and retreat of each tooth of a rotating ferromagnetic object, such as a ferromagnetic gear. The magnetic field associated with the ferromagnetic object is often detected by one or more magnetic field sensing elements, such as Hall elements or magnetoresistance elements, which provide a signal proportional to a detected magnetic field (i.e., a magnetic field signal). The proximity detector processes the magnetic field signal to generate an output signal that changes state each time the magnetic field signal crosses a threshold. Therefore, when the proximity detector is used to detect the approach and retreat of each tooth of a rotating ferromagnetic gear, the output signal is a square wave representative of rotation of the ferromagnetic gear. It will be understood that the proximity detector, like the current sensor described above, senses a magnetic field. The proximity detector senses a magnetic field associated, for example, with the gear teeth.

Magnetic field sensors are also known. Like the current sensor and the proximity detector described above, one type of magnetic field sensor uses a magnetic field sensing element (for example a Hall effect element or magnetoresistance element) in the presence of a magnetic field. The magnetic field sensing element generates an output signal having a magnitude proportional to the magnetic field. It will be understood that the magnetic field sensor, like the proximity detector and the current sensor, senses a magnetic field.

Various parameters characterize the performance of current sensors, proximity detectors, and magnetic field sensors, including sensitivity and linearity. Sensitivity is related to the magnitude of a change in the output from the current sensor, proximity detector, or magnetic field sensor in response to a sensed current, a sensed ferromagnetic object, or a magnetic field, respectively. Linearity is related to the degree to which the output varies in direct proportion to the sensed current, the sensed ferromagnetic object, or the sensed magnetic field, respectively. One of ordinary skill in the art will recognize that above-described output can either be in the form of a voltage output or a current output.

The sensitivity of the current sensor, the proximity detector, and the magnetic field sensor is related to a variety of factors. One important factor is the magnitude of the sensed magnetic field. For this reason, some current sensors, proximity detectors, and magnetic field sensors use a flux concentrator disposed in order to concentrate a magnetic flux and to direct the concentrated magnetic flux through the magnetic field sensing element.

SUMMARY OF THE INVENTION

The present invention provides a current sensor, a proximity detector, and a magnetic field sensor (collectively referred to herein as integrated sensors) having a magnetic field sensing element and a magnetic flux concentrator integrated together in a packaged integrated circuit.

In accordance with the present invention, an integrated sensor includes a magnetic field sensing element having a maximum response axis and having first and second opposing surfaces. The integrated sensor also includes a first member provided from a soft magnetic material, the first member having an end disposed proximate to the first opposing surface. The integrated sensor also includes a second member provided from a soft magnetic material, the second member having an end disposed proximate to the second opposing surface. A gap is formed between the ends of the first and second members and the magnetic field sensing element is disposed within the gap. With this particular arrangement, the integrated sensor has increased sensitivity.

In one particular embodiment, at least one of the first member and the second member is provided as a respective at least one leadframe portion (i.e., a lead portion of a leadframe). In one particular embodiment, the integrated sensor also includes a substrate, for example a silicon substrate, coupled to the magnetic field sensing element and adapted to provide an electronic circuit.

In one particular embodiment the integrated sensor is responsive to an electrical current through a current carrying conductor. In another embodiment, the integrated sensor is responsive to proximity of a ferromagnetic object, for example, a gear tooth. In another embodiment, the integrated sensor is responsive to a magnetic field external to the integrated sensor.

In accordance with another aspect of the present invention, an integrated sensor includes a magnetic field sensing element having a maximum response axis and having a surface. The integrated sensor also includes a member provided from a soft magnetic material, the member having an end disposed proximate to the surface of the magnetic filed sensing element. The member is provided as a leadframe portion.

With these particular arrangements, the integrated sensor has increased sensitivity.

In accordance with yet another aspect of the present invention, a dual leadframe includes a first leadframe and a second leadframe coupled to the first leadframe. At least a portion of the second leadframe is provided from a soft magnetic material.

With this particular arrangement, the dual leadframe can provide a flux-concentrating member in an integrated circuit.

In accordance with yet another aspect of the present invention, a leadframe includes a first leadframe portion and a second leadframe portion adjacent to the first leadframe portion. The second leadframe portion has a relatively high magnetic permeability.

With this particular arrangement, the leadframe can provide a flux-concentrating member in an integrated circuit.

BRIEF DESCRIPTION OF THE DRAWINGS

The foregoing features of the invention, as well as the invention itself may be more fully understood from the following detailed description of the drawings, in which:

FIG. 2B is pictorial showing a combination of the first leadframe structure of FIG. 2 with the second leadframe structure of FIG. 2A to form a dual leadframe structure that can be used to provide a part of the integrated sensor of FIG. 1;

FIG. 2C is a pictorial showing a metal strip having portion with a low magnetic permeability and a portion with a high magnetic permeability;

DETAILED DESCRIPTION OF THE INVENTION

Figure 1:
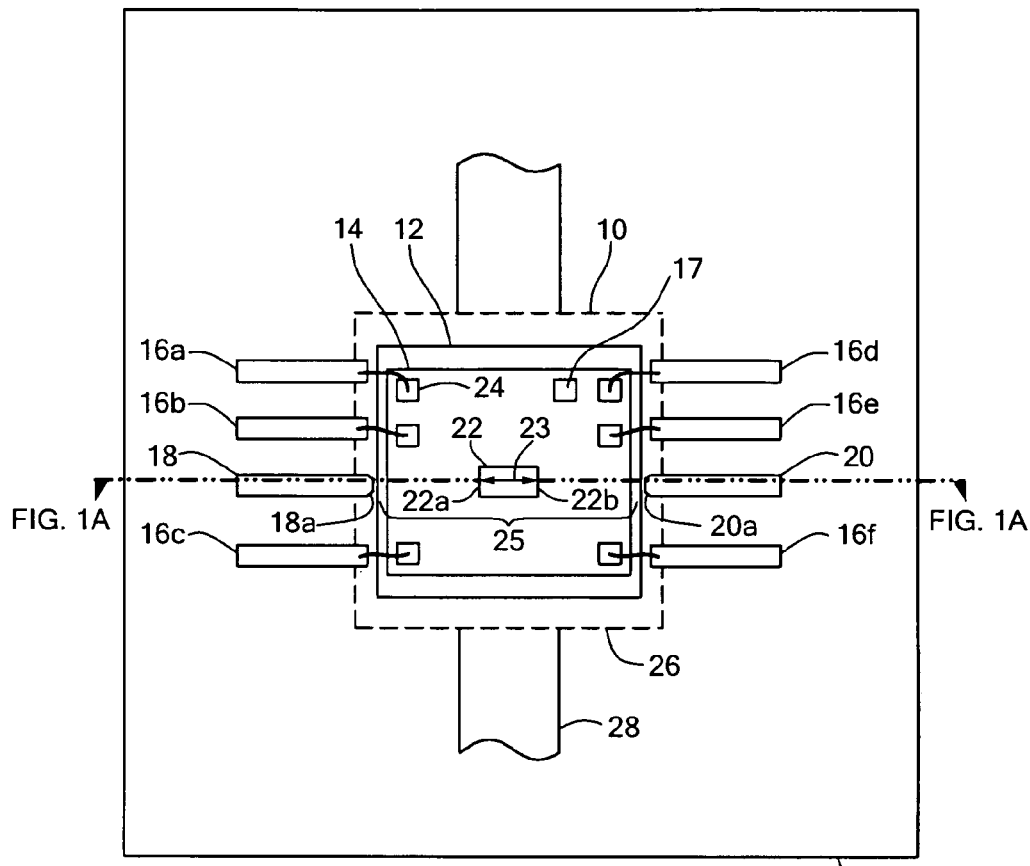
FIG. 1 is a top view pictorial of an integrated sensor in accordance with the present invention.

Before describing the integrated sensor of the present invention, some introductory concepts and terminology are explained. As used herein, the term "magnetic field sensing element" refers to, but is not limited to, a Hall effect element, and a magnetoresistance element. The magnetoresistance element includes, but is not limited to, a giant magnetoresistance element (GMR), a tunneling magnetoresistance element (TMR), and an anisotropic magnetoresistance element (AMR). As used herein, the term "integrated sensor" refers to, but is not limited to, a current sensor, a proximity detector, and a magnetic field sensor, each of which use one or more magnetic field sensing elements to sense a magnetic field. It will be recognized that the magnetoresistance element is generally disposed on top of a substrate, for example, a silicon substrate, while the Hall element is generally diffused into the substrate. However, the Hall element can also be disposed in an epitaxial (epi) layer on the substrate. In figures that follow, the Hall element will be shown to be diffused into the substrate. However, it should be understood that, in alternate embodiments, the Hall element could be disposed in an epitaxial layer of the appropriate carrier concentration on the substrate.

It will also be understood that the magnetoresistance element often has a maximum response axis parallel to the surface of the substrate, while the Hall element often has a maximum response axis perpendicular to the surface of the substrate. However, a Hall element, for example, a vertical Hall element, can also have a maximum response axis parallel to the surface of the substrate.

As used herein, the term "integrated circuit" is used to refer to a substrate, for example, silicon, upon with a circuit is formed. A used herein, the term "packaged integrated circuit" refers to the integrated circuit mounted within a package along with leads, wire bonds, and other elements.

A used herein, the terms "magnetically permeable flux-concentrating material," "magnetically permeable material," and "soft magnetic material" refer to a material having a relatively high magnetic permeability, for example, Permalloy, Hypernik, Supermalloy, Hymu 80®, Mumetal®, Deltamax, Isoperm, Rhometal, Sinimax, 45 Permalloy, Hiperco®, Permendur, Sendust, or 1040 Alloy. Where the soft magnetic material is described in figures below, in some embodiments, the relative permeability is greater than 10. In other embodiments, the relative permeability is greater than one hundred. In still other embodiments, the relative permeability is greater than one thousand. The permeability is selected in accordance with a desired integrated sensor sensitivity and a manufacturing cost. Other magnetic properties of the material can also be considered in the design. For example, magnetic remanence can result in an undesirable offset.

As used herein, the term "leadframe" describes a structure having a frame supporting one or more leads. At least some of the leads provide electrical connections to an integrated circuit portion of a packaged integrated circuit. As is known, frame portions of the lead frame are cut away during packaged integrated circuit manufacture, and the leads remain.

Figure 1A:
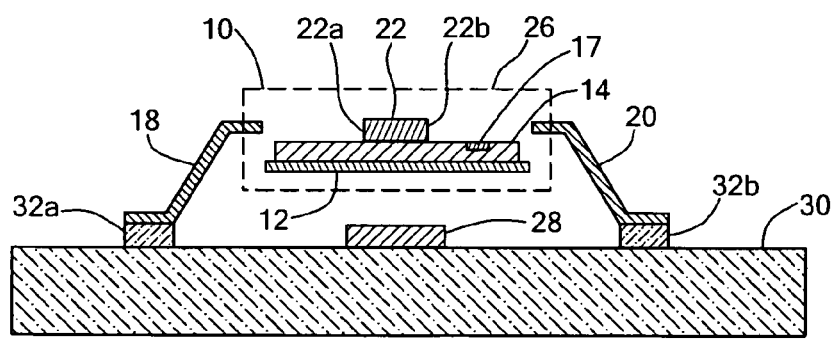
FIG. 1A is a side view pictorial of the integrated sensor of FIG. 1.

Referring now to FIGS. 1 and 1A, in which like elements are shown having like reference designations, an integrated sensor 10, shown here as a current sensor, includes a magnetic field sensing element 22 having a maximum response axis 23 and having first and second opposing surfaces 22a, 22b, respectively. The integrated sensor 10 also includes a first member 18 provided from a soft magnetic material. The first member 18 has an end 18a disposed proximate the first opposing surface 22a. A second member 20 is also provided from a soft magnetic material. The second member 20 has an end 20a disposed proximate the second opposing surface 22b providing a gap 25 between the ends 18a, 20a of the first and second members. The magnetic field sensing element 22 is disposed within the gap 25.

The integrated sensor 10 can further have leads 16a-16f and a base plate 12, each formed as portions of a leadframe. The leadframe is more fully described in conjunction with FIGS. 2-2B. As will become more apparent in conjunction with FIGS. 2-2B, at least one of the first member 18 and the second member 20 can be formed as part of a dual leadframe structure.

The magnetic field sensing element 22, the first member 18, the second member 20, the leads 16a-16f, and the base plate 12 can be provided as a packaged integrated circuit. The integrated sensor 10 can further include a substrate 14 coupled to the magnetic field sensing element 22, which, in one particular embodiment, can be adapted to provide an electronic circuit 17 thereon. The leads 16a-16f, for example, the lead 16a, can each be coupled to a respective bonding pad, for example bonding pad 24, with a wire bond or the like.

In one particular embodiment, the magnetic field sensing element 22 can be a magnetoresistance element disposed on a surface of the substrate 14 as shown. However, in other embodiments, the magnetic field sensor 22 can be a Hall element diffused into a surface of the substrate 14, or a Hall element composed of an appropriate epitaxial layer as described above.

A body 26, shown in phantom lines, can encase portions of the integrated sensor 10. The body 26 can be provided in a variety of materials, including, but not limited to, plastic.

In operation, the magnetic field sensing element 22 is responsive to a magnetic flux generated by an electrical current passing though an electrical conductor 28, which, in one particular embodiment, can be disposed as a conductive trace on a circuit board 30 to which the integrated sensor 10 is mounted via solder pads, e.g., solder pads 32a, 32b. It will be understood that the electrical current passing through the electrical conductor 28 generates a magnetic flux that is generally parallel to the plane of the circuit board 30 in the vicinity of the magnetic field sensing element 22 and also parallel to the plane of the substrate 14. The magnetic flux tends to concentrate in the first and second members 18, 20, respectively. The concentrated magnetic flux also appears within the gap 25, resulting in a higher magnetic flux in the vicinity of the magnetic field sensing element 22 directed along the maximum response axis 23. In one particular embodiment, the ends 18a, 20a of the first and second members 18a, 20a, respectively, can have a shape, for example, a tapered shape, to provide a further concentration of the magnetic flux in the gap 25.

It will be understood that a size of the gap 25 influences the magnitude of the magnetic field experienced by the magnetic field sensing element 22. It will also be understood that some packaged integrated circuit manufacturing techniques require that the gap 25 be sufficiently large so as to allow the substrate 14 to be placed on the base plate 12 without interference. Therefore, the gap 25 is shown to be relatively large. However, in other embodiments, using other manufacturing techniques, the first and second members 18, 20 are longer and are disposed over the top or the substrate 14, and therefore, provide a smaller gap 25 and a corresponding higher magnetic flux along the maximum response axis 23 in response to a current through the electrical conductor 28.

The integrated sensor 10 is shown to be a current sensor, wherein the first member 18 and the second member 20 are adapted to concentrate a magnetic flux in the gap 25 in a direction generally along the maximum response axis 23 of the magnetic field sensing element 22 in response to an electrical current through the electrical conductor 28. However, it should be appreciated that the integrated sensor 10 can function as a proximity sensor wherein the first member 18 and the second member 20 are adapted to concentrate a magnetic flux in the gap 25 in a direction generally along the maximum response axis 23 of the magnetic field sensing element 22 in response to a proximity of a ferromagnetic object (not shown). Also, it should be appreciated that the integrated sensor 10 can function as a magnetic field sensor, wherein the first member 18 and the second member 20 are adapted to concentrate a magnetic flux in the gap 25 in a direction generally along the maximum response axis 23 of the magnetic field sensing element 22 in response to a magnetic field external to the integrated sensor 10.

Figures 2, 2A:
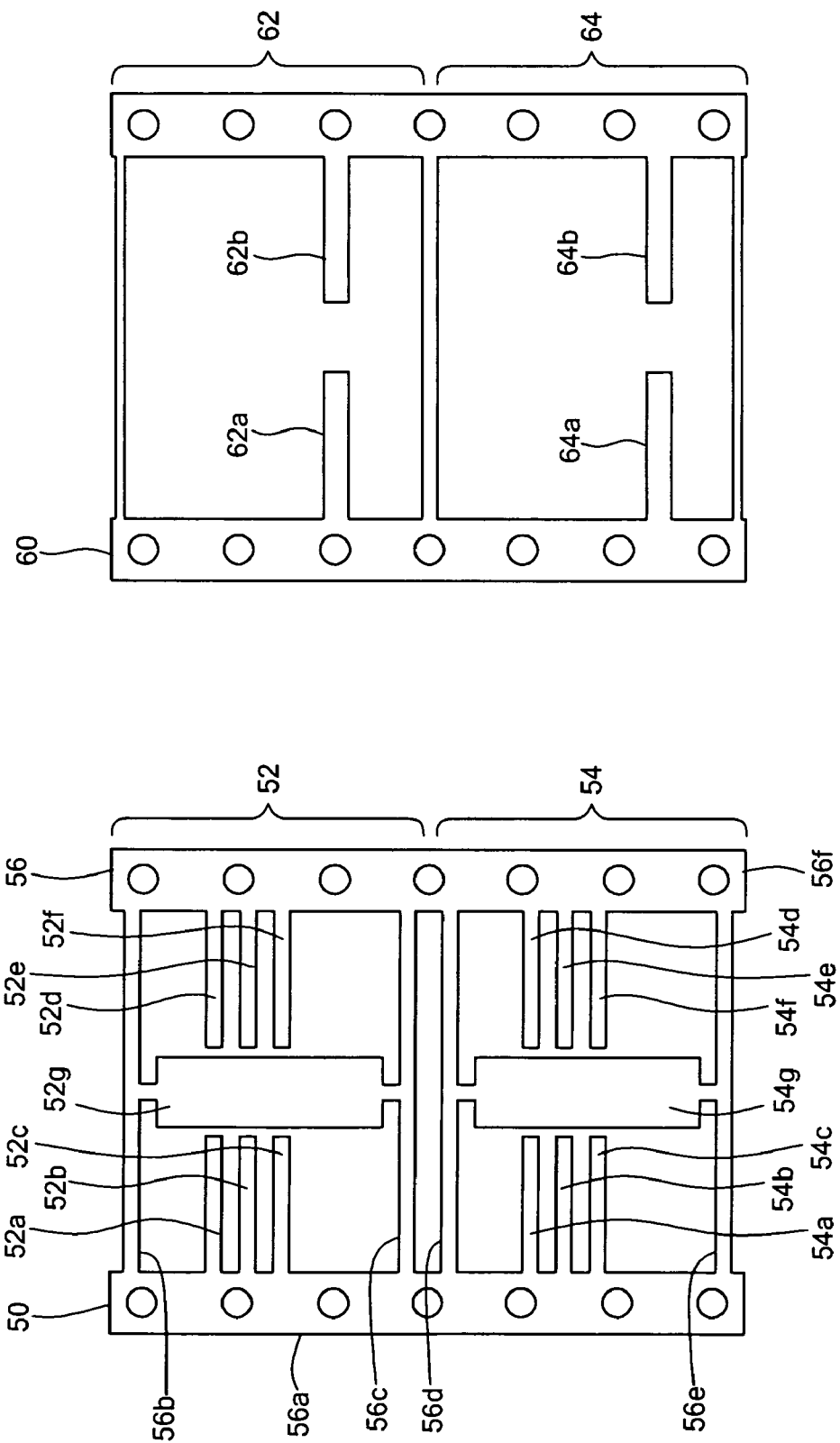
FIG. 2 is pictorial showing a first leadframe structure that can form a part of the integrated sensor of FIG. 1.
FIG. 2A is pictorial showing a second leadframe structure having members that can form parts of the integrated sensor of FIG. 1.

Referring now to FIG. 2, a first leadframe structure 50 includes two leadframes 52, 54. Each of the two leadframes 52, 54 will be recognized to correspond to a position at which an integrated circuit can be placed. While the first leadframe structure 50 is shown having two leadframes 52, 54, it will be recognized that leadframes are often provided in a continual strip or matrix of leadframes. The first leadframe structure 50 can be formed, for example, from a material having a relatively low magnetic permeability, for example, copper.

The leadframe 52 includes leads 52a-52f and a base plate 52g and the leadframe 54 includes leads 54a-54f and a base plate 54g. The two leadframes 52, 54 are coupled together with a frame 56 having frame portions 56a-56f. One of ordinary skill in the art will understand that the frame portions provide a holding arrangement with which an automated machine can position the leads 52a-52f, 54a-54f, and the base plates 52g, 54g for packaged integrated circuit assembly. The frame portions 56a-56f are cut away from the packaged integrated circuit once assembled, and the leads 52a-52f, 54a-54f are shaped to one of a variety of shapes to mount the packaged integrated circuit, for example, to a circuit board. It will also be understood that the base plates 52g, 54g provide bases upon which respective substrates, for example, silicon substrates, can be mounted during packaged integrated circuit assembly.

Referring now to FIG. 2A, a second leadframe structure 60 includes two leadframes 62, 64. The leadframe 62 has members 62a, 62b and the leadframe 64 has members 64a, 64b. The second leadframe structure 60 is formed from a soft magnetic material having a relative high magnetic permeability as described above.

Referring now to FIG. 2B, in which like elements of FIGS. 2-2A are shown having like reference designations, the second leadframe structure 60 can be coupled to the first leadframe structure 50 to form a dual leadframe structure 58, for example, with bars 65a, 65b. In one particular embodiment, the bars 65a, 65b are plastic bars. However, in other embodiments, the bars can be any rigid or semi-rigid material capable of holding the second leadframe structure 60 to the first leadframe structure 50. In an alternate arrangement, the second leadframe structure 60 can be coupled to the first leadframe structure 50 with one or more welds.

Like the leads 52a-52f and 54a-54f, the members 62a, 62b, 64a, 64b can be formed to shapes similar to or the same as the shapes of the leads 52a-52f and 54a-54f during packaged integrated circuit assembly.

While the first leadframe structure 50 and the second leadframe structure 60 are shown, it should be understood that the first leadframe structure 50 can be a portion of a leadframe strip having other leadframes similar to the leadframes 52 and 54, and the second leadframe structure 60 can also be a portion of a leadframe strip having other leadframes similar to the leadframes 62 and 64.

It should be apparent that either one of the members 62a, 64a can correspond for example, to the first member 18 of FIG. 1, and either one of the member 62b, 64b can correspond, for example, to the second member 20 of FIG. 1. Furthermore, the leads 52a-52f can correspond, for example, to the leads 16a-16f of FIG. 1.

Referring now to FIG. 2C, a metal strip 66 includes a first portion 66a having a relatively low magnetic permeability and a second portion 66b formed from a soft magnetic material having a relatively high magnetic permeability. The first and second portions 66a, 66b can be joined, for example, with a welding process or with a forming process. In an alternate embodiment, the second portion 66b can be provided by plating or otherwise depositing a soft magnetic material onto a low magnetic permeability base, which can be the same as or similar to the material of the first portion 66a.

Figure 2D:
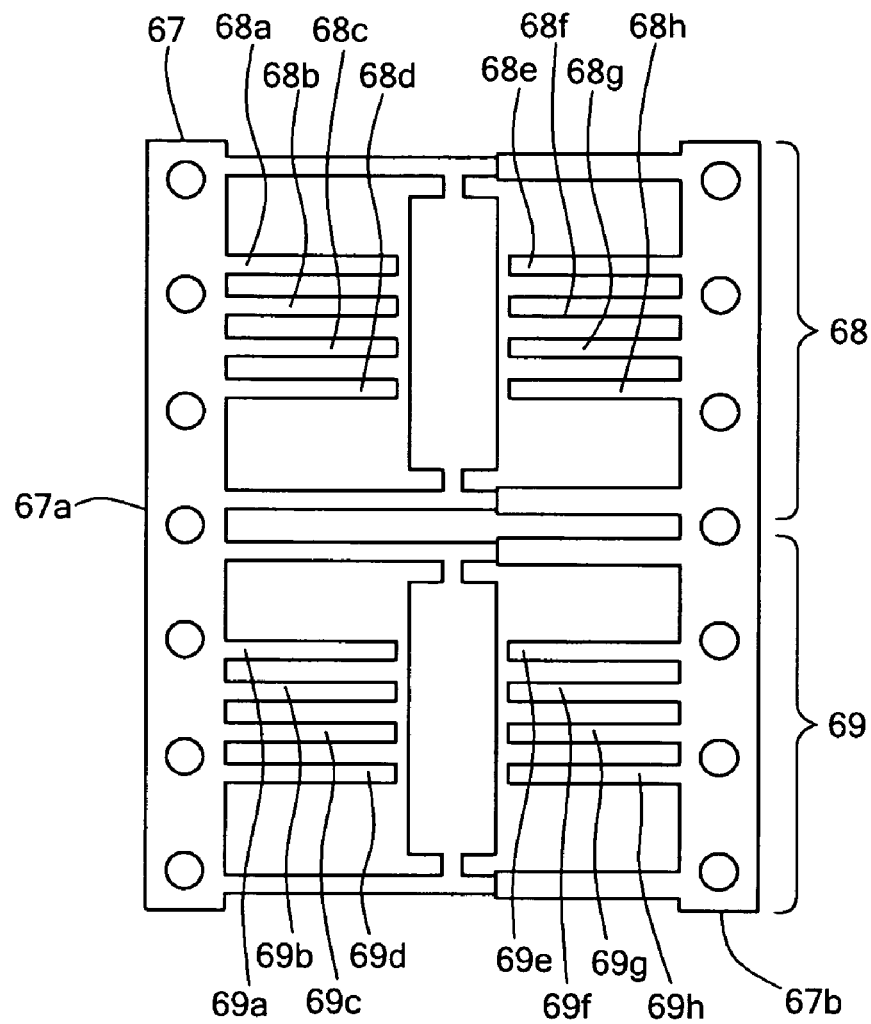
FIG. 2D is a pictorial showing a leadframe structure formed from the metal strip of FIG. 2C.

Referring now to FIG. 2D, a leadframe structure 67 can be stamped, etched, or otherwise formed from the metal strip 66 of FIG. 2C. The leadframe structure 67, includes a first leadframe 68 and a second leadframe 69. The first leadframe 68 includes leads 68a-68d having a relatively low magnetic permeability and members 68e-68h formed from the soft magnetic material having a relatively high magnetic permeability. The second leadframe 69 also includes leads 69a-69d having a relatively low magnetic permeability and members 69e-69h formed from the soft magnetic material having a relatively high magnetic permeability.

It should be understood that the leadframe structure 67 can be a portion of a leadframe strip having other leadframes similar to the leadframes 68 and 69.

It should be apparent that, in an alternate arrangement, a leadframe structure similar to the leadframe structure 67 can be formed by providing a leadframe from a generally uniform material, e.g., copper, and thereafter plating a soft magnetic material onto the leadframe to provide members similar to those shown as members 68e-68h, 69e-69h. Similarly, in another alternate arrangement, a leadframe formed from a generally uniform material can be entirely plated with the soft magnetic material and could thereafter be etched to provide leads and members similar to those shown as the leads 68a-68d, 69a-69d and the members 68e-68h, 69e-69h. Similarly, in another alternate arrangement, an entire meal strip similar to the metal strip 66 but made of a generally uniform material, e.g., copper, can be plated with the soft magnetic material, formed into a leadframe, and thereafter etched to provide the leads 68a-68d, 69a-69d and the members 68e-68h, 69e-69h. In still further arrangements, rather than providing the leads 68a-68d, 69a-69d and the members 68e-68h, 69e-69h at the positions shown, the techniques described above can provide leads and members in other positions, for example the positions of leads and members associated with the dual leadframe structure 58 of FIG. 2B. In all of the above arrangements, the plating can be provided by techniques including, but not limited to, electroplating, sputtering, and evaporation.

Figure 3:
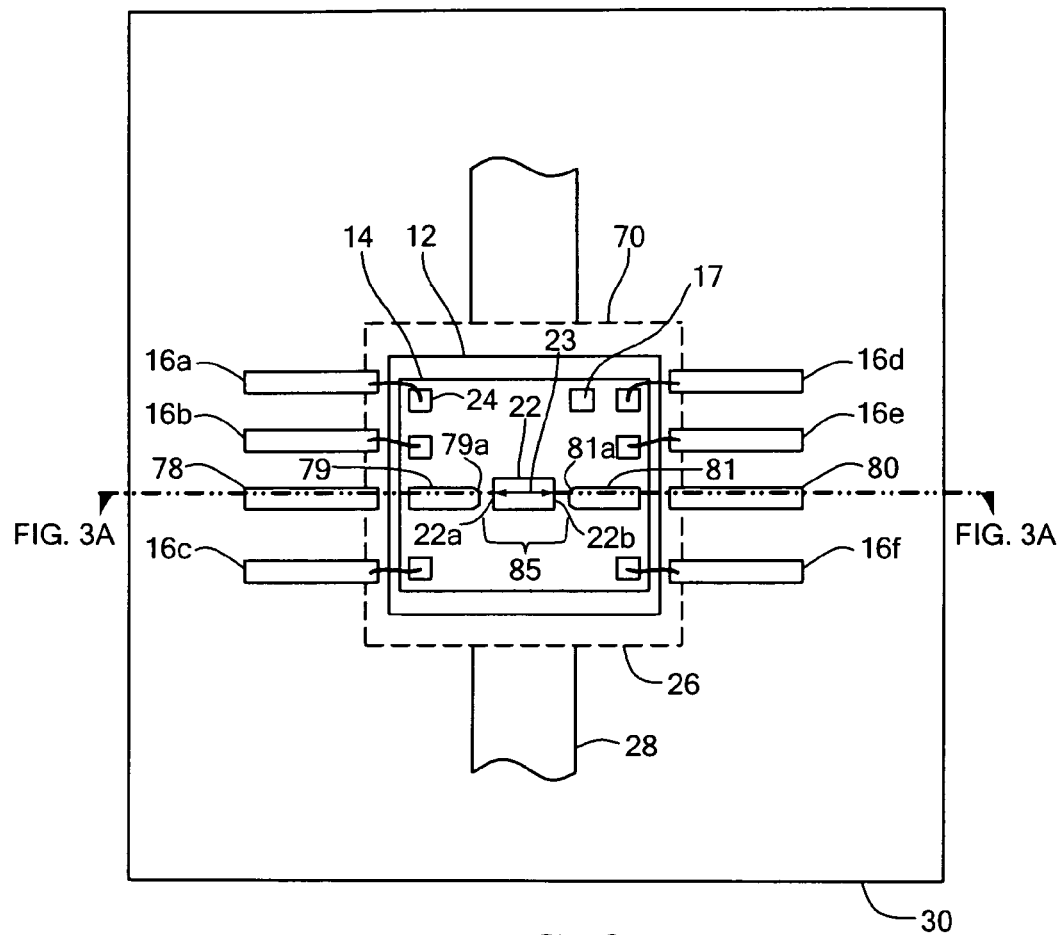
FIG. 3 is a top view pictorial of an alternate embodiment of the integrated sensor.
Figure 3A:
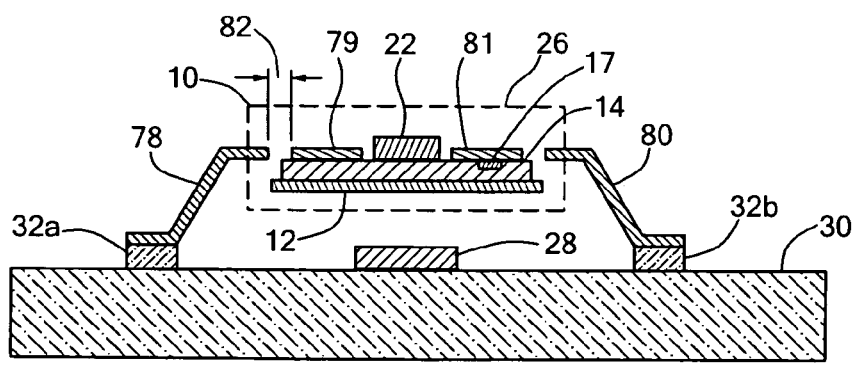
FIG. 3A is a side view pictorial of the integrated sensor of FIG. 3.

Referring now to FIGS. 3 and 3A, in which like elements are shown having like reference designations, and also in which like elements of FIGS. 1 and 1A are shown having like reference designations, an integrated sensor 70 is similar to the integrated sensor 10 of FIGS. 1 and 1A. In FIGS. 3 and 3A, however, a first member, which takes the place of the first member 18 of FIG. 1, is formed as a combination of a first member portion 78 and another first member portion 79. The first member portion 79 has an end 79a disposed proximate the first opposing surface 22a. Also, a second member, which takes the place of the second member 20 of FIG. 1, is formed as a combination of a second member portion 80 and another second member portion 81. The second member portion 81 has an end 81a disposed proximate the second opposing surface 22b providing a gap 85 between the ends 79a, 81a of the first and second member portions 79, 81, and the magnetic field sensing element 22 is disposed within the gap 85. Other characteristics of the integrated sensor 70 are the same as or similar to the integrated sensor 10.

The first member portions 78, 79 and the second member portions 80, 81 can each be formed from a soft magnetic material. The first member portion 78 and the second member portion 80 can be provided, for example, similar to first members 62a, 64a and second members 62b, 64b of FIGS. 2A-2B. The first member portion 79 and the second member portion 81, however, can be deposited onto the substrate 14 forming the gap 85. The deposition can be provided by one of a variety of methods common to packaged integrated circuit manufacture including, for example, sputtering, evaporation, plating, and screen-printing.

The first member portion 78 and the second member portion 80 can be provided, for example, as one of the first members 62a, 64a and one of the second members 62b, 64b in FIGS. 2A-2B, respectively. However, in an alternate embodiment, the first member portion 78 is formed from a lead having a relatively low magnetic permeability, for example, the lead 68c of FIG. 2D, and second member portion 80 is formed from a member having a relatively high magnetic permeability, for example, the member 68g of FIG. 2D.

In operation, as described above, it will be understood that the electrical current passing through the electrical conductor 28 generates a magnetic flux that is generally parallel to the plane of the circuit board 30 in the vicinity of the magnetic field sensing element 22. The magnetic flux tends to concentrate in the first member portion 78, the first member portion 79, the second member portion 80, and the second member portion 81. The concentrated magnetic flux also appears within the gap 85, resulting in a higher magnetic flux in the vicinity of the magnetic field sensing element 22 directed along the maximum response axis 23. In one particular embodiment, the ends 79a, 81a of the first and second members portions 79, 81, respectively, can have a shape, for example, a tapered shape, to provide a further concentration of the magnetic flux in the gap 85.

It will be understood that a size of the gap 85 influences the magnitude of the magnetic field experienced by the magnetic field sensing element 22. It will also be understood that the gap 85 can be provided to bring the first member portion 79 and the second member portion 81 into close proximity to the magnetic field sensing element 22. Therefore, the gap 85 can be smaller than the gap 25 of FIG. 1. Also, because some packaged integrated circuit manufacturing techniques require that the first member portion 78 not interfere as the substrate 14 is placed on the base plate 12, in some embodiments, another gap 82 is formed. The gap 82 tends to reduce the magnetic flux in the gap 85, and in some embodiments, a size of the gap 82, and/or a size of the gap 85, can be used to tailor the integrated sensor 70 to have a desired sensitivity. However, in other embodiments, using other integrated manufacturing techniques, the first member portion 78 is longer and essentially overlaps the first member portion 79, in which case, the gap 82 is reduced or eliminated.

Figure 4:
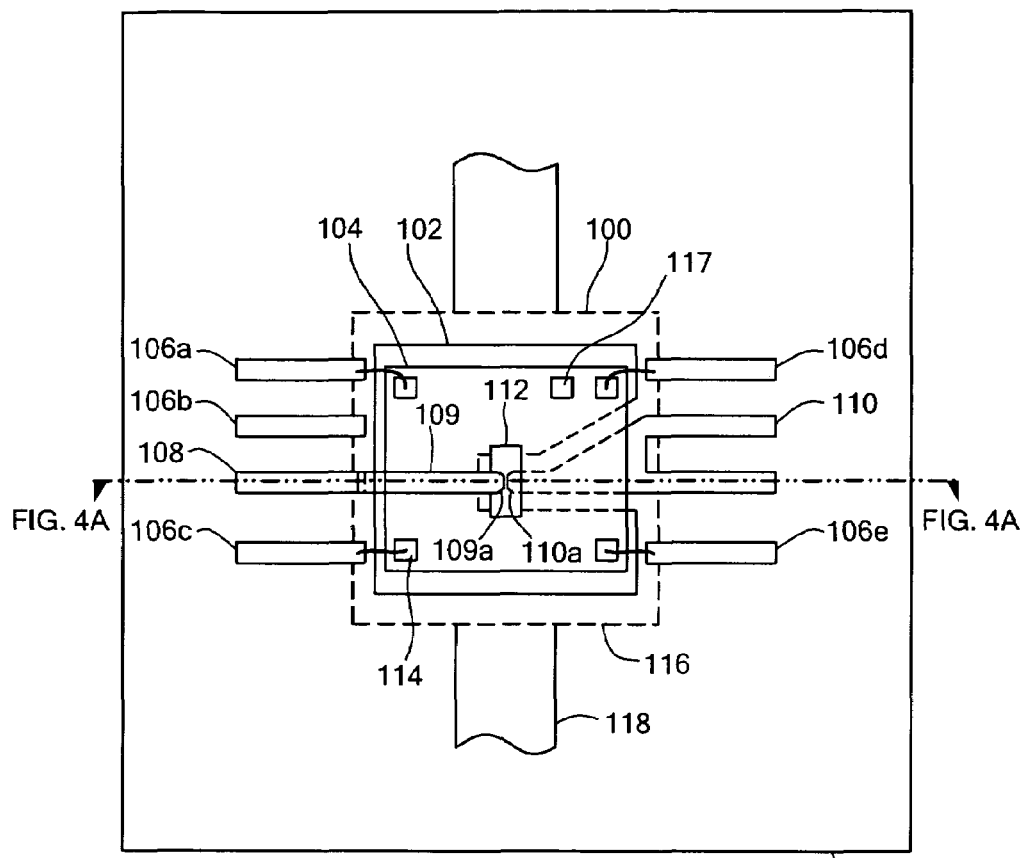
FIG. 4 is a top view pictorial of another alternate embodiment of the integrated sensor.
Figure 4A:
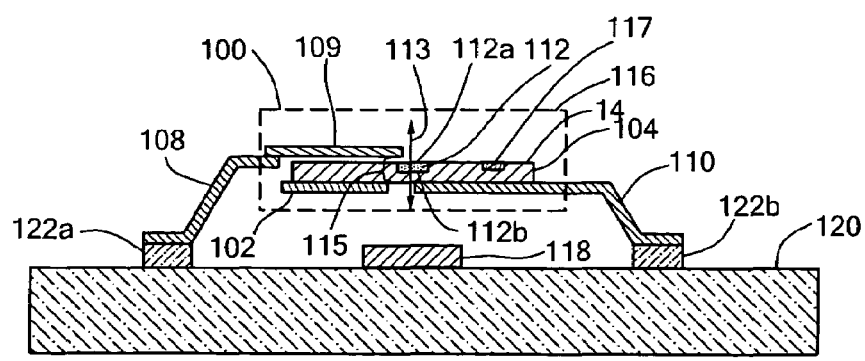
FIG. 4A is a side view pictorial of the integrated sensor of FIG. 4.

Referring now to FIGS. 4 and 4A, in which like elements are shown having like reference designations, an integrated sensor 100, shown here as a current sensor, includes a magnetic field sensing element 112 having a maximum response axis 113 and having first and second opposing surfaces 112a, 112b, respectively. In one particular embodiment, the magnetic field sensing element 112 can be a Hall element. The integrated sensor 100 also includes a first member provided as a first member portion 108 and another first member portion 109. The first member portion 109 can be a ferromagnetic clip that can be provided from a soft magnetic material. The first member portion 108 can also be provided from a soft magnetic material.

The first member portion 109 has an end 109a disposed proximate the first opposing surface 112a. A second member 110 is also provided from a soft magnetic material. The second member 110 has an end 110a disposed proximate the second opposing surface 112b forming a gap 115 between the ends 109a, 110a of the first member portion 109 and the second member 110, and the magnetic field sensing element 112 is disposed within the gap 115.

The integrated sensor 100 can further include leads 106a-106e and a base plate 102 68h each formed as portions of a leadframe. The leadframe is more fully described in conjunction with FIGS. 2-2B.

The magnetic field sensing element 112, the first member portions 108, 109, the second member 110, the leads 106a-106e, and the base plate 102 can be provided as a packaged integrated circuit. The integrated sensor 100 can further include a substrate 104 coupled to the magnetic field sensing element 112, which, in one particular embodiment, can be adapted to provide an electronic circuit 117 thereon. The leads 106a-106e, for example the lead 106c, can each be coupled to a respective bonding pad, for example, bonding pad 114, with a wire bond or the like.

In one particular embodiment, the magnetic field sensing element 112 can be a Hall element diffused into a surface of the substrate 104 as shown (or it may be comprised of an epi layer of appropriate doping concentration as described above).

A body 116, shown in phantom lines, can encase portions of the integrated sensor 100 as shown. The body 116 can be provided in a variety of materials, including, but not limited to, plastic.

In operation, the magnetic field sensing element 112 is responsive to a magnetic flux generated by an electrical current passing through an electrical conductor 118, which, in one particular embodiment, can be disposed as a conductive trace on a circuit board 120 to which the integrated sensor is mounted via solder pads, e.g., solder pads 122a, 122b. It will be understood that the electrical current generates a magnetic flux that is generally parallel to the plane of the circuit board 120, in the vicinity of the magnetic field sensing element 112. The magnetic flux tends to concentrate in the first member portions 108, 109 and in the second member 110. The concentrated magnetic flux also appears within the gap 115, but in a direction generally perpendicular to the plane of the circuit board 120, resulting in a higher magnetic flux in the vicinity of the magnetic field sensing element 112 directed along the maximum response axis 113. In one particular embodiment, ends 109a and 110a of the first member portion 109 and second member 110, respectively, can have a shape, for example, a tapered shape, to provide a further concentration of the magnetic field in the gap 115.

It will be understood that a size of the gap 115 influences the magnitude of the magnetic field experienced by the magnetic field sensing element 112. With this particular embodiment, the gap 115 is approximately equal to a thickness of the substrate 104. In other embodiments, however, the first member portion 109 can be formed upward providing a larger gap 115 in order to achieve a desired magnetic flux, and therefore, can be used to tailor the integrated sensor 100 to have a desired sensitivity. In still other embodiments, a portion of the element 110 could be formed downward away from the substrate 104 to change the gap 115.

The integrated sensor 100 is shown to be a current sensor, wherein the first member portions 108, 109 and the second member 110 are adapted to concentrate a magnetic flux in the gap 115 in a direction generally along the maximum response axis 113 of the magnetic field sensing element 112 in response to an electrical current though the electrical conductor 118. However, it should be appreciated that the integrated sensor 100 can function equally well as a proximity sensor wherein the first member portions 108, 109 and the second member 110 are adapted to concentrate a magnetic flux in the gap 115 in a direction generally along the maximum response axis 113 of the magnetic field sensing element 112 in response to a proximity of a ferromagnetic object (not shown). Also, it should be appreciated that the integrated sensor 100 can function equally well as a magnetic field sensor, wherein the first member portions 108, 109 and the second member 110 are adapted to concentrate a magnetic flux in the gap 115 in a direction generally along the maximum response axis 113 of the magnetic field sensing element 112 in response to a magnetic field external to the integrated sensor 100.

The first member portion 108 and the second member 110 can be formed from a soft magnetic material. The first member portion 108 and the second member 110 can be provided, for example, as one of the first members 62a, 64a and one of the second members 62b, 64b in FIGS. 2A-2B. However, in an alternate embodiment the first member portion 108 is formed from a lead having a relatively low magnetic permeability, for example, the lead 68c of FIG. 2D, and the second member portion 110 is formed from members having a relatively high magnetic permeability, for example, the members 68g, 68h of FIG. 2D.

Figure 5:
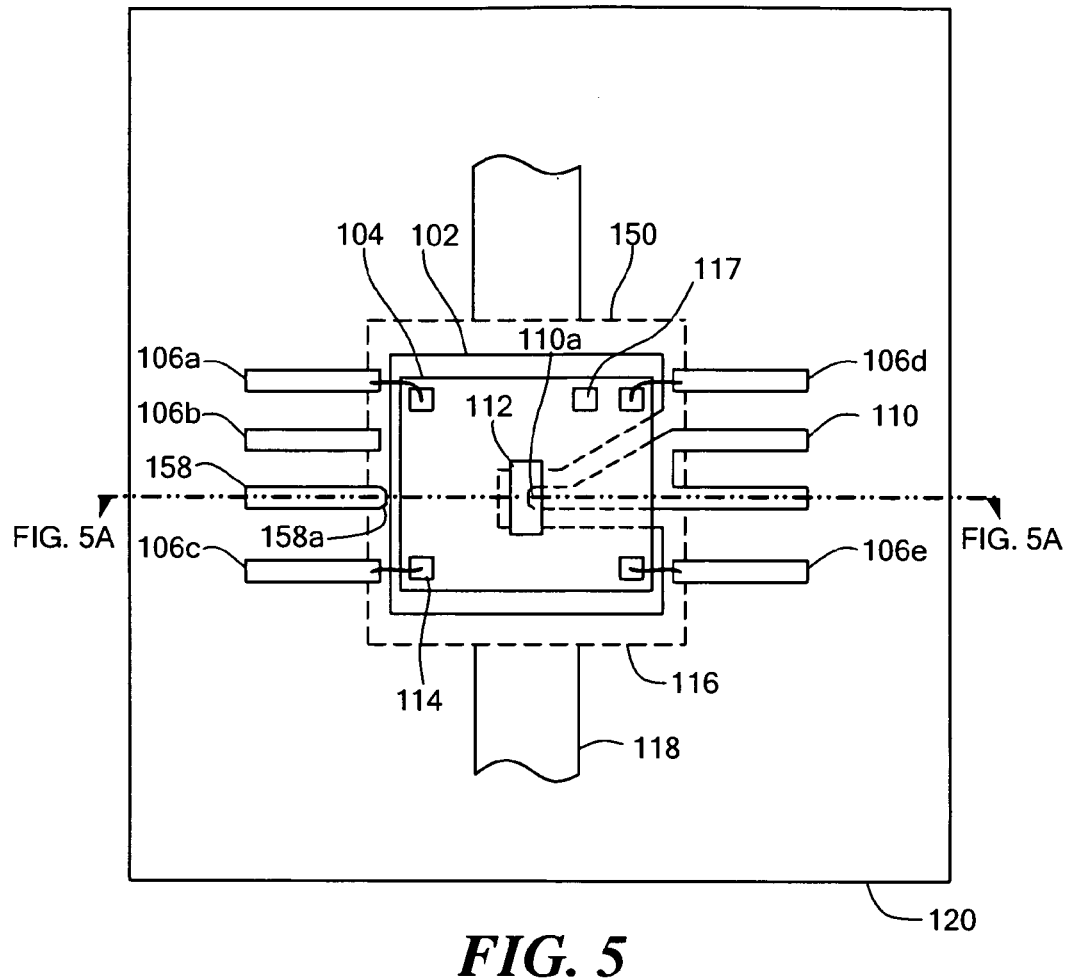
FIG. 5 is a top view pictorial of yet another alternate embodiment of the integrated sensor.
Figure 5A:
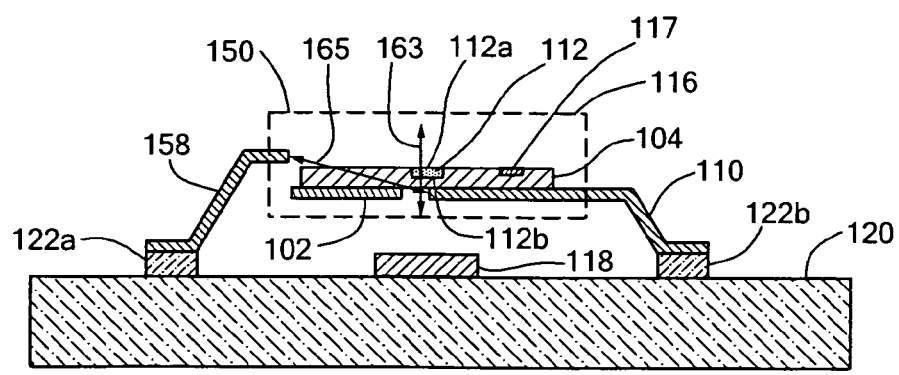
FIG. 5A is a side view pictorial of the integrated sensor of FIG. 5.

Referring now to FIGS. 5 and 5A, in which like elements are shown having like reference designations, and also like elements of FIGS. 4 and 4A are shown having like reference designations, an integrated sensor 150 is similar to the integrated sensor 100 of FIGS. 4 and 4A. In FIGS. 5 and 5A, however, a first unitary member 158 takes the place of the first member of FIGS. 4 and 4A, which is formed as a combination of a first member portion 108 and another first member portion 109. The first member 158 has an end 158a disposed proximate the first opposing surface 112a. A gap 165 is formed between the ends 158a, 110a of the first and second members, and the magnetic field sensing element 112 is disposed within the gap 165. Other characteristics of the integrated sensor 150 are the same as or similar to the integrated sensor 100.

The first member 158 and the second member 110 can be formed from a soft magnetic material. The first member 158 and the second member 110 can be provided, for example, as one of the first members 62a, 64a and a corresponding one of the second members 62b, 64b in FIGS. 2A-2B. However, in an alternate arrangement, the first member portion 158 is formed from a lead having a relatively low magnetic permeability, for example, the lead 68c of FIG. 2D, and the second member portion 110 is formed from members having a relatively high magnetic permeability, for example, the members 68g, 68h of FIG. 2D.

In operation, as described above, it will be understood that the electrical current passing through the electrical conductor 118 generates a magnetic flux that is generally parallel to the plane of the circuit board 120 in the vicinity of the magnetic field sensing element 112. The magnetic flux tends to concentrate in the first and second members 108, 110, respectively. The concentrated magnetic flux also appears within the gap 165, but in a direction generally tilted relative to the plane of the circuit board 120, resulting in a magnetic flux in the vicinity of the magnetic field sensing element 112 having a component directed along the maximum response axis 163. In one particular embodiment, ends 158a and 110a of the first and second members, 108, 110, respectively, can have a shape, for example, a tapered shape, to provide a further concentration of the magnetic field in the gap 165.

It will be understood that a size of the gap 165, and an angle of the gap 165 relative to the maximum response axis 163, influences the magnitude of the magnetic field experienced by the magnetic field sensing element 112 along the maximum response axis 163. It will also be understood that some packaged integrated circuit manufacturing techniques require that that gap 165 be sufficiently large so as to allow the substrate 104 to be place on the base plate 102 without interference. Therefore, the gap 165 is shown to be relatively large. However, in other embodiments, using other integrated manufacturing techniques, the first member 158 is longer and is disposed over the top of the substrate 104, and therefore, provides a smaller gap 165 and a corresponding higher magnetic flux along the maximum response axis 163 in response to a current through the electrical conductor 118.

Figure 6:
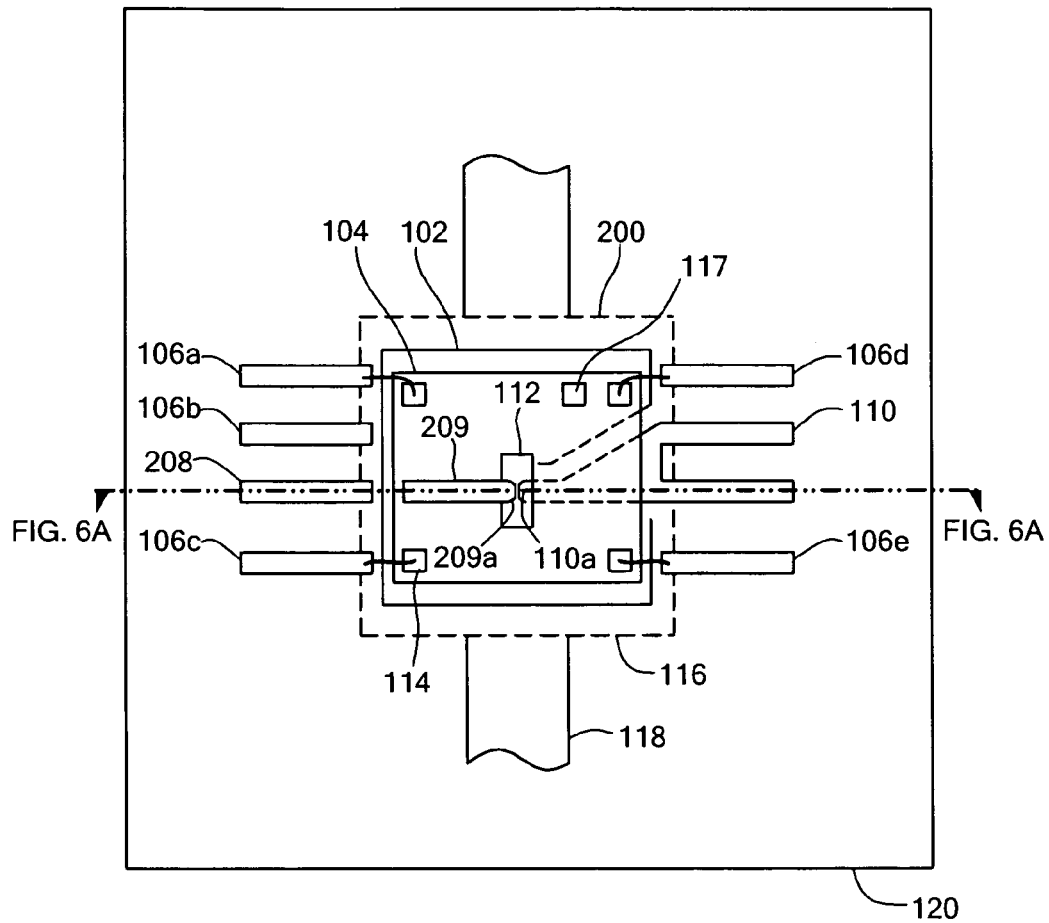
FIG. 6 is a top view pictorial of yet another embodiment of the integrated sensor.
Figure 6A:
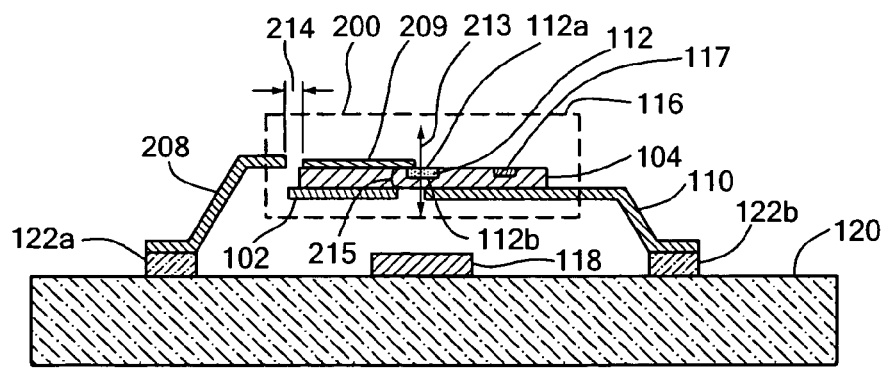
FIG. 6A is a side view pictorial of the integrated sensor of FIG. 6.

Referring now to FIGS. 6 and 6A, in which like elements are shown having like reference designations, and also like elements of FIGS. 4 and 4A are shown having like reference designations, an integrated sensor 200 is similar to the integrated sensor 100 of FIGS. 4 and 4A. In FIGS. 6 and 6A, however, a first member, which takes the place of the first member portions 108, 109 FIGS. 4 and 4A, is formed as a combination of a first member portion 208 and another first member portion 209. The first member portion 209 has an end 209a disposed proximate the first opposing surface 112a. A gap 215 is formed between the ends 209a, 110a of the first and second members, and the magnetic field sensing element 112 is disposed within the gap 215. Other characteristics of the integrated sensor 200 are the same as or similar to the integrated sensor 100.

The first member portions 208, 209 and the second member 110 can each be formed from a soft magnetic material. The first member portion 208 and the second member 110 can be provided for example, as one of the first members 62a, 64a and one of the second members 62b, 64b in FIGS. 2A-2B. The first member portion 209, however, can be deposited onto the substrate 120, forming the gap 215. The deposition can be provided by one of a variety of methods common to integrated circuit manufacture including, for example, sputtering and plating.

In an alternate embodiment, the first member portion 208 is formed as a lead having a relatively low magnetic permeability, for example, the lead 68c of FIG. 2D, and the second member 110 is formed from members having a relatively high magnetic permeability, for example, the members 68g, 68h of FIG. 2D. In this particular embodiment, the first member 208 is a lead rather than a member formed form a soft magnetic material.

In operation, as described above, it will be understood that the electrical current passing through the electrical conductor 118 generates a magnetic flux that is generally parallel to the plane of the circuit board 120 in the vicinity of the magnetic field sensing element 112. The magnetic flux tends to concentrate in the first member portions 208, 209 and in the second member 110. The concentrated magnetic flux also appears within the gap 215, but in a direction generally perpendicular to the plane of the circuit board 120, resulting in a higher magnetic flux in the vicinity of the magnetic field sensing element 112 directed along the maximum response axis 213. In one particular embodiment, ends 209a and 110a of the first member portion and the second member, 209, 110, respectively, can have a shape, for example, a tapered shape, to provide a further concentration of the magnetic field in the gap 215.

It will be understood that a size of the gap 215 influences the magnitude of the magnetic field experienced by the magnetic field sensing element 22. It will also be understood that the gap 215 can be provided to bring the first member portion 209 and the second member portion 110 into close proximity to the magnetic field sensing element 112. Therefore, the gap 215 can be smaller than the gap 25 of FIG. 1. Also, because some packaged integrated circuit manufacturing techniques require that the first member portion 208 not interfere as the substrate 104 is placed on the base plate 102, in some embodiments, another gap 214 is formed. The gap 214 tends to reduce the magnetic flux in the gap 215, and in some embodiments, a size of the gap 214, and/or a size of the gap 215, can be used to tailor the integrated sensor 200 to have a desired sensitivity. However, in other embodiments, using other integrated manufacturing techniques, the first member portion 208 is longer and essentially overlaps the first member portion 209, in which case, the gap 214 is reduced or eliminated.

The embodiments shown above each have first and second members disposed to form a gap into which a magnetic field sensing element is disposed. However, in alternate arrangements, only the first or the second member is provided as a soft magnetic material in proximity to the magnetic field sensing element, and no gap is formed. However, these alternate arrangements still provide a concentration of flux in the vicinity of the magnetic field sensing element.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. An integrated sensor, comprising:
    a magnetic field sensing element having a maximum response axis and having first and second opposing surfaces;
    a first member provided from a soft magnetic material, the first member having an end disposed proximate to the first opposing surface; and
    a second member provided from a soft magnetic material, the second member having an end disposed proximate to the second opposing surface providing a gap generally oriented along a line between the ends of the first and second members, wherein the magnetic field sensing element is disposed within the gap, and wherein the gap is generally aligned with the maximum response axis of the magnetic field sensing element.

2. The integrated sensor of claim 1, further comprising a leadframe, wherein at least one of the first member or the second member is provided as a respective at least one leadframe portion.

3. The integrated sensor of claim 2, further including a weld that welds at least one of the first member or the second member to the leadframe.

4. The integrated sensor of claim 2, wherein the magnetic field sensing element, the first member, the second member, and the at least one leadframe portion are provided as a packaged integrated circuit.

5. The integrated sensor of claim 2, wherein the first member is provided as a first leadframe portion and the second member is provided as a second leadframe portion.

6. The integrated sensor of claim 2, wherein a portion of at least one of the first member or the second member comprises a plating upon the at least one leadframe portion.

7. The integrated sensor of claim 1, wherein the magnetic field sensing element is disposed generally in a plane and wherein at least a portion of the first member and at least a portion of the second member are disposed generally in the plane.

8. The integrated sensor of claim 1, wherein the magnetic field sensing element is disposed generally in a first plane, at least a portion of the first member is disposed generally in a second plane, and at least a portion of the second member is disposed generally in a third plane, and wherein the second and third planes are generally parallel to and on opposite sides of the first plane.

9. The integrated sensor of claim 1, wherein a size of the gap is selected in accordance with a predetermined flux density at the magnetic field sensing element.

10. The integrated sensor of claim 1, wherein the first member and the second member are adapted to concentrate a magnetic flux in the gap in a direction generally along the maximum response axis of the magnetic field sensing element in response to an electrical current.

11. The integrated sensor of claim 10, wherein the electrical current is in a conductive trace on a circuit board.

12. The integrated sensor of claim 1, further comprising:
a substrate coupled to the magnetic field sensing element; and an electronic circuit disposed upon the substrate.

13. The integrated sensor of claim 12, wherein a least a portion of the first member and the second member is deposited onto the substrate.

14. The integrated sensor of claim 12, wherein the magnetic field sensing element is disposed upon the substrate.

15. The integrated sensor of claim 1, wherein the ends of the first and second members have a shape selected in accordance with a predetermined flux density at the magnetic field sensing element.

16. The integrated sensor of claim 15, wherein the ends of the first and second members have a tapered shape.

17. The integrated sensor of claim 1, wherein the magnetic field sensing element is a magnetoresistance element.

18. The integrated sensor of claim 1, wherein the magnetic field sensing element is a Hall element.

19. The integrated sensor of claim 1, wherein the magnetic field sensing element is a vertical Hall element.

20. The integrated sensor of claim 1, wherein the first member and the second member are adapted to concentrate a magnetic flux in the gap in a direction generally along the maximum response axis of the magnetic field sensing element in response to a proximity of a ferromagnetic object.

21. The integrated sensor of claim 1, wherein the first member and the second member are adapted to concentrate a magnetic flux in the gap in a direction generally along the maximum response axis of the magnetic field sensing element in response to a magnetic field external to the integrated sensor.

22. The integrated sensor of claim 1, wherein the magnetic field sensing element is disposed generally in a first plane, at least a portion of the first member is disposed generally in a second plane generally parallel to the first plane, and at least a portion of the second member is disposed generally in a third plane generally parallel to the first plane.

23. The integrated sensor of claim 1, further comprising a leadframe having a plurality of leads, wherein a portion of at least one of the first member or the second member comprises at least a respective portion of a respective one of the plurality of leads.

24. The integrated sensor of claim 1, further comprising a substrate supporting the magnetic field sensing element on a surface of the substrate, wherein the maximum response axis of the magnetic field sensing element is substantially perpendicular to the surface of the substrate.

25. An integrated sensor, comprising:
a substrate;
a leadframe proximate to the substrate, the leadframe having a plurality of leads and a member; and
a magnetic field sensing element disposed upon the substrate, the magnetic field sensing element having a maximum response axis and having a surface; wherein the member is provided from a soft magnetic material, the member having an end disposed proximate to the surface of the magnetic field sensing element, wherein the member is adapted to concentrate a magnetic flux in a direction generally along the maximum response axis of the magnetic field sensing element in response to a selected one of an electrical current, a proximity of a ferromagnetic object, or a magnetic field external to the integrated sensor.

26. The integrated sensor of claim 25, further comprising:
a weld that welds the portion of the member to the leadframe.

27. The integrated sensor of claim 25, wherein the substrate, the magnetic field sensing element, and the member are provided as a packaged integrated circuit.

28. The integrated sensor of claim 25, wherein the magnetic field sensing element is disposed generally in a plane, and wherein at least a portion of the member is disposed generally in the plane.

29. The integrated sensor of claim 25, wherein the magnetic field sensing element is disposed generally in a first plane, and at least a portion of the member is disposed generally in a second plane different than the first plane, wherein the second plane is generally parallel to the first plane.

30. The integrated sensor of claim 25, further comprising an electronic circuit disposed upon the substrate.

31. The integrated sensor of claim 25, wherein the electrical current is in a conductive trace on a circuit board.

32. The integrated sensor of claim 25, wherein an end of the member has a shape selected in accordance with a predetermined flux density at the magnetic field sensing element.

33. The integrated sensor of claim 32, wherein the end of the member has a tapered shape.

34. The integrated sensor of claim 25, wherein another portion of the member comprises a deposition disposed upon the substrate.

35. The integrated sensor of claim 25, wherein the substrate supports the magnetic field sensing element on a surface of the substrate, wherein, the maximum response axis of the magnetic field sensing element is substantially perpendicular to the surface of the substrate, and wherein the member provides an increase in flux density in a direction generally perpendicular to the surface of the substrate.

* * * * *

UNITED STATES PATENT AND TRADEMARK OFFICE
CERTIFICATE OF CORRECTION

PATENT NO. : 7,476,953 B2
APPLICATION NO. : 11/051124
DATED : January 13, 2009
INVENTOR(S) : William P. Taylor et al.

It is certified that error appears in the above-identified patent and that said Letters Patent is hereby corrected as shown below:

Column 2, line 14, delete "that above-described" and replace with --that the above-described--.

Column 2, line 64, delete "filed" and replace with --field--.

Column 3, line 25, delete "is pictorial" and replace with --is a pictorial--.

Column 3, line 27, delete "is pictorial" and replace with --is a pictorial--.

Column 3, line 30, delete "is pictorial" and replace with --is a pictorial--.

Column 3, line 35, delete "having portion" and replace with --having a portion--.

Column 4, line 23, delete "with" and replace with --which--.

Column 4, line 24, delete ". A" and replace with --. As--.

Column 4, line 27, delete "A" and replace with --As--.

Column 5, line 25, delete "though" and replace with --through--.

Column 7, line 36, delete "meal" and replace with --metal--.

Column 8, line 33-34, delete "members" and replace with --member--.

Column 9, line 10, delete "base plate 102 68h" and replace with --base plate 102--.

Column 10, line 1, delete "though" and replace with --through--.

Column 11, line 10, delete "place" and replace with --placed--.

Column 11, line 24, delete "108, 109 FIGS. 4 and 4A," and replace with --108, 109 of FIGS. 4 and 4A,--.

UNITED STATES PATENT AND TRADEMARK OFFICE
CERTIFICATE OF CORRECTION

PATENT NO. : 7,476,953 B2
APPLICATION NO. : 11/051124
DATED : January 13, 2009
INVENTOR(S) : William P. Taylor et al.

It is certified that error appears in the above-identified patent and that said Letters Patent is hereby corrected as shown below:

Column 11, line 49, delete "form" and replace with --from--.

Column 13, line 26, delete "a" and replace with --at--.

Signed and Sealed this

Eighteenth Day of August, 2009

David J. Kappos
*Director of the United States Patent and Trademark Office*